(12) United States Patent
Kwon et al.

(10) Patent No.: US 12,107,593 B2
(45) Date of Patent: Oct. 1, 2024

(54) HIGH-SPEED HIGH-RESOLUTION ANALOG-TO-DIGITAL CONVERTER

(71) Applicant: LG ELECTRONICS INC., Seoul (KR)

(72) Inventors: Yigi Kwon, Seoul (KR); Byoung Han Min, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 147 days.

(21) Appl. No.: 17/797,994

(22) PCT Filed: Feb. 19, 2020

(86) PCT No.: PCT/KR2020/002417
§ 371 (c)(1),
(2) Date: Aug. 5, 2022

(87) PCT Pub. No.: WO2021/167129
PCT Pub. Date: Aug. 26, 2021

(65) Prior Publication Data
US 2023/0084050 A1 Mar. 16, 2023

(51) Int. Cl.
*H03M 1/10* (2006.01)
(52) U.S. Cl.
CPC ............................. *H03M 1/1014* (2013.01)
(58) Field of Classification Search
CPC .................................................. H03M 1/1014

USPC ................................. 341/155, 163, 159, 156
See application file for complete search history.

(56) References Cited

U.S. PATENT DOCUMENTS

| 8,643,529 | B2 | 2/2014 | Lin | |
| 10,103,742 | B1 * | 10/2018 | Guo | ...................... H03M 1/145 |
| 10,277,243 | B2 | 4/2019 | Kim et al. | |
| 2018/0331690 | A1 * | 11/2018 | Kim | ...................... H03M 1/361 |

FOREIGN PATENT DOCUMENTS

| KR | 10-1287097 B1 | 7/2013 |
| KR | 10-1435978 B1 | 9/2014 |
| KR | 10-2016-0084686 A | 7/2016 |
| KR | 10-1711542 B1 | 3/2017 |
| KR | 10-1844555 B1 | 4/2018 |

\* cited by examiner

*Primary Examiner* — Peguy Jean Pierre
(74) *Attorney, Agent, or Firm* — Birch, Stewart, Kolasch & Birch, LLP

(57) ABSTRACT

An analog-to-digital converter of one embodiment in the present disclosure may comprise a first conversion unit generating an internal clock signal, generating a first digital code and a residual signal by converting an input signal in a successive approximation register (SAR) method in response to the internal clock signal and generating a flash clock signal in response to an external clock signal, a second conversion unit generating a second digital code by converting the residual signal in a flash method in response to the flash clock signal, and an output circuit generating an output digital signal in response to the first digital code and the second digital code.

15 Claims, 6 Drawing Sheets

HIGH-SPEED HIGH-RESOLUTION ANALOG-TO-DIGITAL CONVERTER

CROSS-REFERENCE TO RELATED APPLICATION

This application is the National Phase of PCT International Application No. PCT/KR2020/002417 filed on Feb. 19, 2020, the contents of which are hereby expressly incorporated by reference into the present application.

TECHNICAL FIELD

Disclosed herein is an analog-to-digital converter that operates at high speed and ensures a high resolution.

BACKGROUND ART

Recently, a system-on-a-chip (SoC) for various applications such as a digital TV and a digital camera has been widely used. The SoC includes an analog-to-digital converter that receives an analog signal and converts the analog signal into a digital signal.

When converting a signal including image information, such as a digital TV or a digital camera, a high-speed high-resolution analog-to-digital converter is needed for the uninterrupted reproduction of images. In particular, to be applied to a mobile device, an analog-to-digital converter needs to be able to operate with less power.

DESCRIPTION OF INVENTION

Technical Problems

The objective of the present disclosure is to provide an analog-to-digital converter that can operate at high speed.

Another objective of the present disclosure is to provide an analog-to-digital converter that can ensure a high resolution.

Yet another objective of the present disclosure is to provide an analog-to-digital converter that can operate with less power.

Aspects according to the present disclosure are not limited to the above ones, and other aspects and advantages that are not mentioned above can be clearly understood from the following description and can be more clearly understood from the embodiments set forth herein. Additionally, the aspects and advantages in the present disclosure can be realized via means and combinations thereof that are described in the appended claims.

Technical Solutions

An analog-to-digital converter of one embodiment can be installed in a smaller area.

The analog-to-digital converter of one embodiment can operate with less power.

The analog-to-digital converter of one embodiment can ensure a high resolution while operating at high speed.

The analog-to-digital converter of one embodiment includes an SAR conversion unit, an amplification unit and a flash conversion unit, and the SAR conversion unit can operate asynchronously.

The analog-to-digital converter of one embodiment may include a first conversion unit generating an internal clock signal, generating a first digital code and a residual signal by converting an input signal in a successive approximation register (SAR) method in response to the internal clock signal, and generating a flash clock signal in response to an external clock signal, a second conversion unit generating a second digital code by converting the residual signal in a flash method in response to the flash clock signal, and an output circuit generating an output digital signal in response to the first digital code and the second digital code.

The internal clock signal of the analog-to-digital converter of one embodiment may change its state, based on determination of bit data of the first digital code.

In the analog-to-digital converter of one embodiment, the first conversion unit may include a clock unit outputting the flash clock signal and a sampling clock signal in response to the external clock signal, an input unit sampling the input signal in response to the sampling clock signal and generating the residual signal, based on the sampled input signal and the first digital code, a comparator outputting a comparative signal depending on a value of the residual signal, a control unit generating the internal clock signal in response to the comparative signal and the sampling clock signal, and an SAR circuit generating the first digital code, based on the comparative signal.

In the analog-to-digital converter of one embodiment, the input signal may include a first input signal and a second input signal that are complementary, the residual signal may include a first residual signal and a second residual signal that are complementary, and the sampling clock signal may include a first sampling clock signal that is activated during sampling from a time point when a first edge of the external clock signal is supplied, and a second sampling clock signal that is a signal where the first sampling clock signal is inverted, the input unit may include a plurality of first input circuits sampling the first input signal in response to the first sampling clock signal and generating the first residual signal in response to the sampled first input signal and the second sampling clock signal, and a plurality of second input circuits sampling the second input signal in response to the first sampling clock signal and generating the second residual signal in response to the sampled second input signal and the second sampling clock signal.

In the analog-to-digital converter of one embodiment, each of the plurality of first input circuits of the input unit may include a capacitor having one end that connects to a terminal to which the first residual signal is output, a first switch connecting between a terminal, to which the first input signal is supplied, and the other end of the capacitor, and being turned on and off in response to the first sampling clock signal, a second switch connecting between a terminal, to which a first reference signal is supplied, and the other end of the capacitor, and being turned and off in response to a signal where a signal of corresponding bit data of the first digital code and the second sampling clock signal are AND calculated, and a third switch connecting between a terminal, to which a second reference signal is supplied, and the other end of the capacitor, and being turned on and off in response to a signal where a signal, where a signal of corresponding bit data of the first digital code is inverted, and the second sampling clock signal are AND calculated.

In the analog-to-digital converter of one embodiment, each of the plurality of second input circuits of the input unit may include a capacitor having one end that connects a terminal to which the second residual signal is output, a first switch connecting between a terminal, to which the second input signal is supplied, and the other end of the capacitor, and being turned on and off in response to the first sampling clock signal, a second switch connecting between a terminal, to which a first reference signal is supplied, and the other end of the capacitor, and being turned and off in response to a signal where a signal of corresponding bit data of the first digital code and the second sampling clock signal are AND calculated, and a third switch connecting between a terminal, to which a second reference signal is supplied, and the other end of the capacitor, and being turned on and off in response to a signal where a signal of corresponding bit data of the first digital code, and a signal, where the second sampling clock signal is inverted, are AND calculated.

In the analog-to-digital converter of one embodiment, the comparative signal may include a first comparative signal and a second comparative signal that are complementary, and the comparator may compare the first residual signal and the second residual signal and output the first comparative signal and the second comparative signal.

The analog-to-digital converter of one embodiment may further include a calibration circuit that outputs a calibration signal in response to the first comparative signal and the second comparative signal, and the calibration signal corrects an offset of the comparator.

In the analog-to-digital converter of one embodiment, the internal clock signal may include a first internal clock signal and a second internal clock signal that are complementary, and the calibration signal may include a first calibration signal, a second calibration signal, a third calibration signal and a fourth calibration signal, the comparator may include a first transistor connecting between a terminal, to which reference voltage is supplied, and a first node and including a gate to which the first internal clock signal is supplied, a second transistor connecting between the first node and a second node and including a gate to which the first residual signal is supplied, a third transistor connecting between the first node and a third node and including a gate to which the second residual signal is supplied, a fourth transistor connecting between the second node and a terminal to which driving voltage is supplied and including a gate to which the internal clock signal is supplied, a fourth transistor connecting between the third node and the terminal to which driving voltage is supplied and including a gate to which the internal clock signal is supplied, a sixth transistor connecting between the terminal to which reference voltage is supplied and a first output node to which the first comparative signal is output and including a gate to which a signal of the second node is supplied, a seventh transistor connecting between the terminal to which reference voltage is supplied and the first output node, an eighth transistor connecting between the terminal to which reference voltage is supplied and a second output node to which the second residual signal is output, a ninth transistor connecting between the terminal to which reference voltage is supplied and the second output node and including a gate to which a signal of the third node is supplied, a tenth transistor connecting between the first output node and the fourth node and including a gate that electrically connects to a gate of the eighth transistor, an eleventh transistor connecting between the second output node and the fourth node and including a gate that electrically connects to a gate of the seventh transistor, a twelfth transistor connecting between the fourth node and the terminal to which driving voltage is supplied and including a gate to which the second internal clock signal is supplied, a first current source connecting between the terminal to which driving voltage is supplied and the second node and adjusting magnitude of electric current that flows between the terminal, to which driving voltage is supplied, and the second node in response to the first calibration signal, a second current source connecting between the terminal to which driving voltage is supplied and the third node and adjusting magnitude of electric current that flows between the terminal, to which driving voltage is supplied, and the third node in response to the third calibration signal, a third current source connecting between the first output node and the terminal to which reference voltage is supplied and adjusting magnitude of electric current that flows between the first output node and the terminal, to which reference voltage is supplied, in response to the third calibration signal, and a fourth current source connecting between the second output node and the terminal to which reference voltage is supplied and adjusting magnitude of electric current that flows between the second output node and the terminal, to which reference voltage is supplied, in response to the fourth calibration signal.

In the analog-to-digital converter of one embodiment, the output circuit may generate the output digital signal by combining the first digital code and the second digital code while correcting an error.

In the analog-to-digital converter of one embodiment, the first digital code may be n (integers of 2 or greater) bits, and the second digital code may be m (integers of 2 or greater) bits, and the output circuit may correct an error by correcting a least significant bit (LSB) of the first digital code depending on a most significant bit (MSB) of the second digital code.

In the analog-to-digital converter of one embodiment, the first conversion unit may generate a comparative signal that is determined depending on magnitude of the residual signal, and based on the comparative signal, determine bit data of the first digital code.

The analog-to-digital converter of one embodiment may further include a calibration circuit that outputs a calibration signal for correcting an offset of the first conversion unit, based on the comparative signal, and at this time, the first conversion unit may include at least one or more of current sources that operate in response to the calibration signal.

In the analog-to-digital converter of one embodiment, the first conversion unit, the second conversion unit, the output circuit, and the calibration circuit may be integrated on a signal chip.

In the analog-to-digital converter of one embodiment, the second conversion unit may include an amplification unit outputting an amplified residual signal by amplifying the residual signal, and a flash conversion unit converting the amplified residual signal to the second digital code in response to the flash clock signal.

In the analog-to-digital converter of one embodiment, the first conversion unit may be disposed in a first area of a chip, the amplification unit may be disposed in a second area adjacent to the first area of the chip in the first direction, the output circuit may be disposed in a third area adjacent to the second area of the chip in the first direction, the calibration circuit may be disposed in a fourth area adjacent to the first area of the chip in a second direction across the first direction, and the flash conversion unit may be disposed in a fifth area adjacent to the fourth area of the chip in the first direction and adjacent to the second area and the third area of the chip in the second direction.

Advantageous Effects

An analog-to-digital converter of one embodiment can operate at high speed.

The analog-to-digital converter of one embodiment can ensure a high resolution.

The analog-to-digital converter of one embodiment can operate with less power.

Specific effects are described along with the above-described effects in the section of detailed description.

DETAILED DESCRIPTION OF EXEMPLARY EMBODIMENTS

Figure 1:
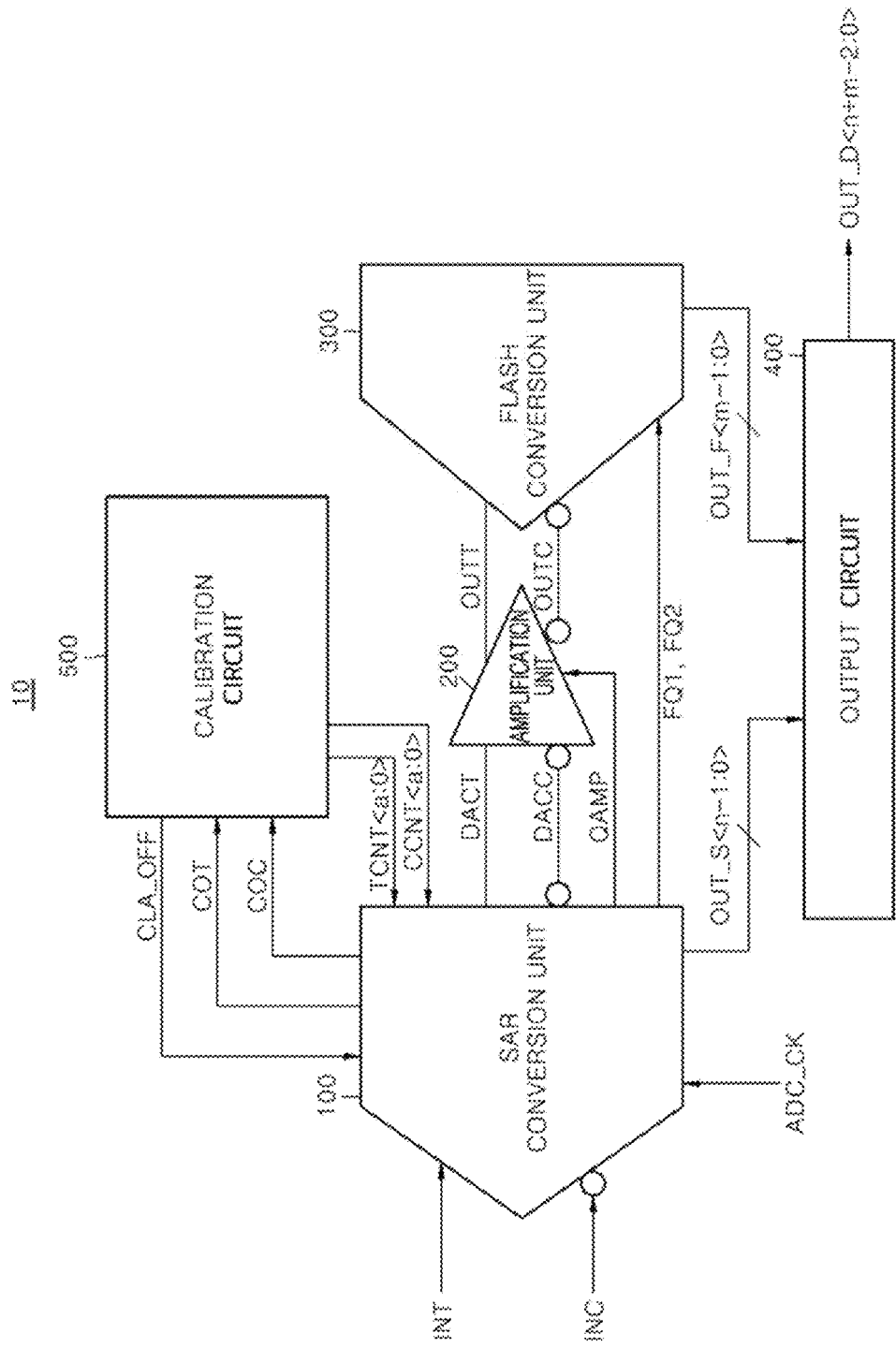
FIG. 1 is a block diagram schematically showing the configuration of an analog-to-digital converter of one embodiment.

The above-described aspects, features and advantages are specifically described hereafter with reference to the accompanying drawings such that one having ordinary skill in the art to which the present disclosure pertains can embody the technical spirit of the disclosure easily. In the disclosure, detailed description of known technologies in relation to the disclosure is omitted if it is deemed to make the gist of the disclosure unnecessarily vague. Below, preferred embodiments according to the disclosure are specifically described with reference to the accompanying drawings. In the drawings, identical reference numerals can denote identical or similar components.

The terms "first", "second" and the like are used herein only to distinguish one component from another component. Thus, the components should not be limited by the terms. Certainly, a first component can be a second component unless stated to the contrary.

When any one component is described as being "connected", "coupled", or "connected" to another component, any one component can be directly connected or coupled to another component, but an additional component can be "interposed" between the two components or the two components can be "connected", "coupled", or "connected" by an additional component.

Throughout the disclosure, each component can be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "include" and the like, set forth herein, are not interpreted as necessarily including all the stated components or steps but can be interpreted as excluding some of the stated components or steps or can be interpreted as including additional components or steps.

Throughout the disclosure, the terms "A and/or B" as used herein can denote A, B or A and B, and the terms "C to D" can denote C or greater and D or less, unless stated to the contrary.

Hereafter, an analog-to-digital converter in several embodiments is described.

FIG. 1 is a block diagram schematically showing the configuration of an analog-to-digital converter 10 of one embodiment, and the analog-to-digital converter 10 of one embodiment may include an SAR conversion unit 100, an amplification unit 200, a flash conversion unit 300, an output circuit 400, and a calibration circuit 500.

In FIG. 1, an input signal INT, INC, a residual signal DACT, DACC, and an amplified residual signal OUTT, OUTC may be respectively a complementary signal or a differential signal.

The analog-to-digital converter 10 of one embodiment may convert an input signal INT, INC according to the Successive Approximation Register (SAR) method to generate a first digital code (OUT_S<n−1:0>) which is an n-bit digital signal, and a residual signal DACT, DACC, convert the residual signal DACT, DACC according to the flash method to generate a second digital code (OUT_F<m−1:0>) which is an m-bit digital signal, combine the first digital code (OUT_S<n−1:0>) and the second digital code (OUT_F<m−1:0>), while correcting an error to generate an output digital signal (OUT_D<n+m−2:0>) of an n+m−1-bit. The residual signal DACT, DACC may be a signal that corresponds to a value calculated by deducting a value corresponding to the first digital code (OUT_S<n−1:0>) from a value corresponding to the input signal INT, INC.

The SAR conversion unit 100 may input an input signal INT, INC, convert the input signal INT, INC according to the SAR method to generate a first digital code (OUT_S<n−1:0>) and a residual signal DACT, DACC, and output the first digital code (OUT_S<n−1:0>) and the residual signal DACT, DACC. The SAR conversion unit 100 may input an external clock signal ADC_CK and sample the input signal INT, INC in response to the external clock signal ADC_CK. Specifically, the SAR conversion unit 100 may generate a sampling clock signal in response to the external clock signal ADC_CK, and sample the input signal INT, INC in response to the sampling clock signal. Additionally, the SAR conversion unit 100 may convert an input signal INT, INC to a first digital code (OUT_S<n−1:0>) in response to an internal clock signal that is generated internally. That is, the SAR conversion unit 100 may consecutively generate from a most significant bit (MSB) (i.e., OUT_S<n−1>) of the first digital code (OUT_S<n−1:0>) to a least significant bit (LSB) (i.e., OUT_S<0>) of the first digital code (OUT_S<n−1:0>) in response to the internal clock signal. At this time, the internal clock signal may be generated in response to the generation of each bit data of the first digital code (OUT_S<n−1:0>). That is, the SAR conversion unit 100 may generate a first digital code (OUT_S<n−1:0>) in an asynchronous way.

Further, the SAR conversion unit 100 may generate an amplifier clock signal QAMP and output the same to the amplification unit 200. The amplifier clock signal QAMP may be a signal that is activated after a conversion operation for generating a first digital code (OUT_S<n−1:0>) is completed and inactivated in response to an external clock signal ADC_CK.

Further, the SAR conversion unit 100 may generate flash clock signals FQ1, FQ2 and output the same to the flash conversion unit 300. The flash clock signals FQ1, FQ2 may be signals that are generated in response to an external clock signal ADC_CK. That is, the flash clock signals FQ1, FQ2 may be a signal that is synchronous with an external clock signal ADC_CK.

Furthermore, the SAR conversion unit 100 may correct the offset of an inner circuit in response to calibration signals (TCNT<a:0>, CCNT<a:0>) that are output from the calibration circuit 500. To this end, the SAR conversion unit 100 may output a comparative signal COT, COC to the calibration circuit 500. The comparative signal COT, COC may be a signal that is used to determine a value of each bit of a first digital code (OUT_S<n−1:0>). Additionally, the SAR conversion unit 100 may stop correcting the offset of the inner circuit in response to a calibration ending signal CAL_OFF that is output from the calibration circuit 500. In FIG. 1, the calibration signals (TCNT<a:0>, CCNT<a:0>) are illustrated as digital signals but may be analog signals.

The amplification unit 200 may amplify residual signals DACT, DACC in response to an amplifier clock signal QAMP and output amplified residual signals OUTT, OUTC.

The flash conversion unit 200 may generate a second digital code (OUT_F<m−1:0>), in which the amplified residual signal OUTT, OUTC is converted to a digital signal, in response to flash clock signals FQ1, FQ2. and output the second digital code (OUT_F<m−1:0>).

The output circuit 400 may input a first digital code (OUT_S<n−1:0>) and a second digital code (OUT_F<m−1:0>), and while correcting an error, and combine the first digital code (OUT_S<n−1:0>) and the second digital code (OUT_F<m−1:0>) and output an output digital signal (OUT_D<n+m−2:0>). For example, the output circuit 400 may correct an error by adjusting a value of the LSB (OUT_S<0>) of the first digital code (OUT_S<n−1:0>) depending on the MSB (OUT_F<m−1>) of the second digital code (OUT_F<m−1:0>). Specifically, when the MSB (OUT_F<m−1>) of the second digital code (OUT_F<m−1:0>) is 1, the output circuit 400 may change the value of LSB (OUT_S<0>) of the first digital code (OUT_S<n−1:0>), and when the MSB (OUT_F<m−1>) of the second digital code (OUT_F<m−1:0>) is 0, the output circuit 400 may not change the value of the LSB (OUT_S<0>) of the first digital code (OUT_S<n−1:0>).

Additionally, the output circuit 400 may determine the first digital code (OUT_S<n−1:0>), where the LSB (OUT_S<0>) is adjusted, as higher bits ((OUT_D<n+m−2:m−1>) of the output digital signal (OUT_D<n+m−2:0>), and the second digital code (i.e., OUT_F<m−2:0>), where the MSB (OUT_F<m−1>) is excluded, as lower bits of the output digital signal (OUT_D<n+m−2:0>), and output the output digital signal (OUT_D<n+m−2:0>).

In some cases, the output circuit 400 may simply combine the first digital code and the second digital code and generate an output digital signal without correcting an error, and output the output digital signal.

The calibration circuit 500 may output calibration signals TCNT, CCNT and a calibration ending signal CAL_OFF in response to a comparative signal COT, COC. Specifically, the calibration circuit 500 may change the calibration signals TCNT, CCNT until the comparative signal COT, COC becomes an unstable value (e.g., a continuously toggling value), and activate the calibration ending signal CAL_OFF while outputting the calibration signals TCNT, CCNT of the time point at which the comparative signal COT, COC becomes an unstable value.

In some cases, the calibration circuit 500 may be omitted.

Figure 2:
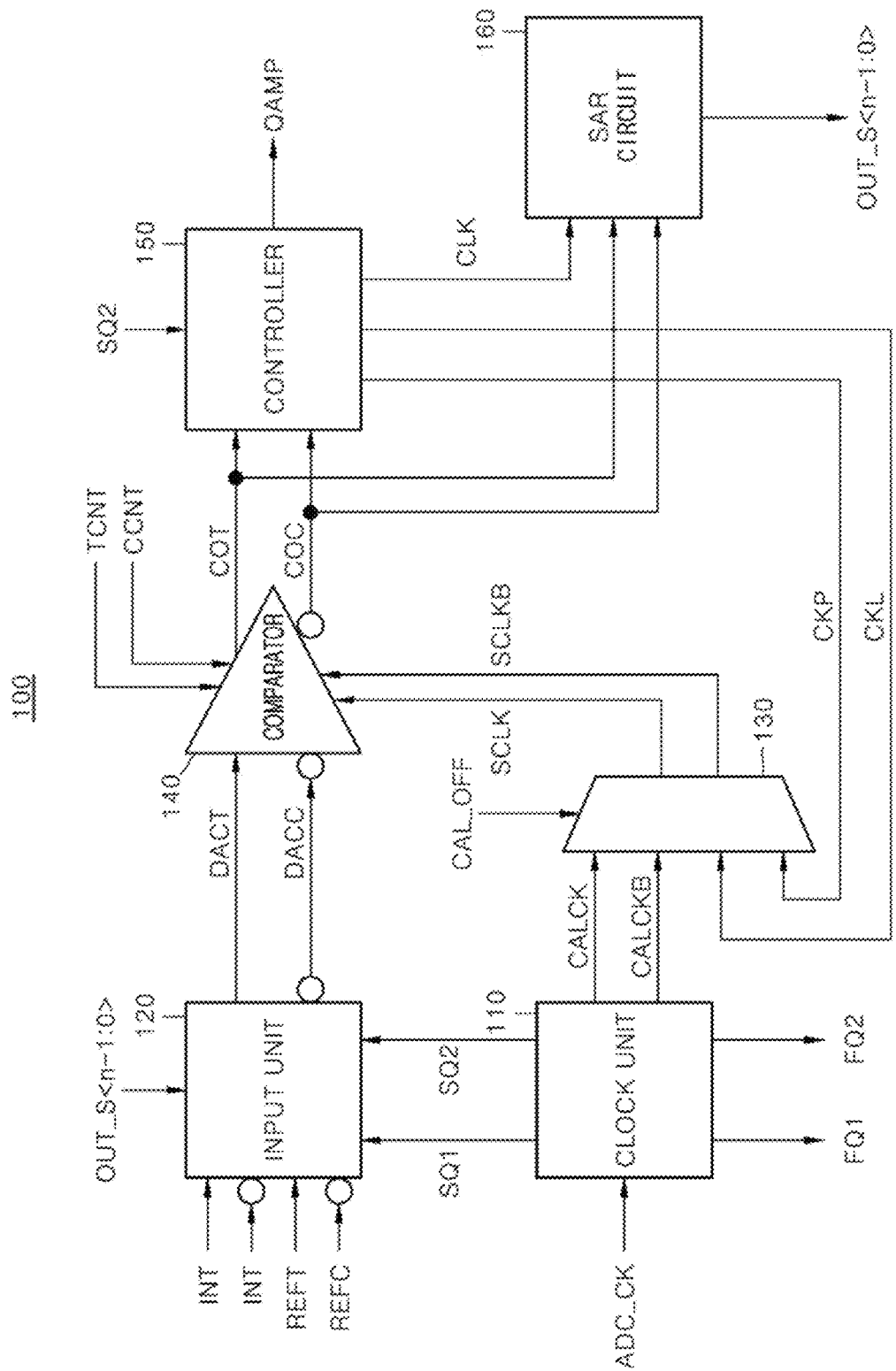
FIG. 2 is a block diagram schematically showing the configuration of an example of an SAR conversion unit of the analog-to-digital converter in FIG. 1.

FIG. 2 is a view schematically showing the configuration of an example of an SAR conversion unit 100 of the analog-to-digital converter in FIG. 1, and the SAR conversion unit 100 may include a clock unit 110, an input unit 120, a selection unit 130, a comparator 140, a controller 150, and an SAR circuit 160.

The clock unit 110 may input an external clock signal ADC_CK, and generate sampling clock signals SQ1, SQ2, calibration clock signals CALCK, CALCKB and flash clock signals FQ1, FQ2 in response to the external clock signal ADC_CK. The sampling clock signals SQ1, SQ2, calibration clock signals CALCK, CALCKB and flash clock signals FQ1, FQ2 may be signals that synchronize with the external clock signals ADC_CK. For example, a first sampling clock signal SQ1 may be a signal that is activated from the time point at which the state of the external clock signal ADC_CK changes from a first state (e.g., a low level) to a second state (e.g., a high level), for a predetermined sampling period. A second sampling clock signal SQ2 may be signal where the first sampling clock signal SQ1 is inverted, which is activated from the time point at which the state of the external clock signal ADC_CK changes from a first state (e.g., a low level) to a second state (e.g., a high level) to the time point at which the sampling period passes by, and which is inactivated at the time point when the state of the external clock signal ADC_CK changes from the first state (e.g., a low level) to the second state (e.g., a high level). The calibration clock signals CALCK, CALCKB may be toggled in a predetermined cycle less than a cycle of the external clock signal ADC_CK after the sampling clock signals SQ1, SQ2 are inactivated. A first calibration clock signal CALCK and a second calibration clock signal CALCKB may be complementary. The flash clock signals FQ1, FQ2 may be toggled in the same cycle as the external clock signal ADC_CK. A first flash clock signal FQ1 and a second flash clock signal FQ2 may be complementary.

The input unit 120 may input an input signal INT, INC, and output a residual signal DACT, DACC in response to the input signal INT, INC, a reference signal REFT, REFC, and a first digital code (OUT_S<n−1:0>). Specifically, the input unit 120 may sample the input signal INT, INC in response to the first sampling clock signal SQL Then the input unit 120 may deduct the reference signal REFT, REFC from the signal sampled in response to each bit of the second sampling clock signal SQ2 and the first digital code (OUT_S<n−1:0>) and/or add the reference signal REFT, REFC to the signal sampled in response to each bit of the second sampling clock signal SQ2 and the first digital code (OUT_S<n−1:0>), and generate a residual signal DACT, DACC. For example, as the input signal INT, INC is supplied to a capacitor in the input unit 120, the input signal INT, INC may be sampled in a way that charges corresponding to the magnitude of the input signal INT, INC are accumulated in the capacitor. Then as the reference signal REFT, REFC is supplied to the capacitor, the charges are discharged from the capacitor or charges the capacitor, and signals corresponding to the charges accumulated in the capacitor may be generated as a residual signal DACT, DACC. The detailed configuration of the input unit 120 is described below with reference to FIG. 3.

The selection unit 130 may select one of a calibration clock signal CALCK, CALCKB and a conversion clock signal CKP, CKL in response to a calibration ending signal CAL_OFF, and output an internal clock signal SCLK, SCLKB. The calibration ending signal CAL_OFF may be a signal that is output from the calibration circuit (500 in FIG. 1) and indicates that a calibration operation of correcting the SAR conversion unit 100's offset, in particular, the comparator 140's offset ends. That is, the selection unit 130 may output the calibration clock signal CALCK, CALCKB as an internal clock signal SCLK, SCLKB in the state where the calibration ending signal CAL_OFF is inactivated (in other words, while the calibration operation is performed), and output the conversion clock signal CKP, CKL as an internal clock signal SCLK, SCLKB as the calibration ending signal CAL_OFF is activated (in other words, as the calibration operation ends).

The comparator 140 may compare the internal clock signals SCLK, SCLKB with the residual signals DACT, DACC, and based on results of the comparison, may output a comparative signal COT, COC. For example, the comparator 140 may compare the magnitude of a first residual signal DACT with the magnitude of a second residual signal DACC in response to the internal clock signal SCLK, SCLKB and based on results of the comparison, output a comparative signal COT, COC or free-charge the comparative signal COT, COC at a predetermined level.

Additionally, the comparator 140 may correct an offset in response to the calibration signal (TCNT<a:0>, CCNT<a:0>). For example, the comparator 140 may include at least one or more of a current source that operates in response to the calibration signal (TCNT<a:0>, CCNT<a:0>). The analog-to-digital converter of one embodiment may correct an offset by adjusting the magnitude of electric currents that flow through the current source.

The detailed configuration of the comparator 140 is described below with reference to FIG. 4.

The controller 150 may output a comparative clock signal CKP, CKL, a logic clock signal CLK, and an amplifier clock signal QAMP in response to the comparative signal COT, COC and the second sampling clock signal SQ2.

The controller 150 may generate and output a comparative clock signal CKP, CKL having n numbers of pulses (i.e., the number of bits of the first digital code (OUT_S<n−1:0>)) and a logic clock signal CLK having n numbers of pulses from the time point at which the second sampling clock signal SQ2 is activated. The comparative clock signal CKP, CKL may be a signal the state of which changes in response to the generation of data of each bit of the first digital code OUT_S. That is, the comparative clock signal CKP, CKL may be a signal the state of which changes as a comparative signal COT, COC is sufficiently input to the degree that each bit of the first digital code OUT_S is determined. After n numbers of pulses are generated, the state of the comparative clock signal CKP, CKL and the state of the logic clock signal CLK may be maintained until the second sampling clock signal SQ2 is activated. That is, in one cycle of the external clock signal ADC_CK, the comparative clock signal CKP, CKL and the logic clock signal CLK may have n numbers of pulses.

The amplifier clock signal QAMP may be a signal that is activated at the time point when the LSB is determined among bits constituting the first digital code OUT_S, and inactivated at the time point when the state of the external clock signal ADC_CK changes from a second state (e.g., a high level) to a first state (e.g., a low level). The time point when the LSB is determined among bits constituting the first digital code OUT_S may be a time point that is right after an n cycle of the internal clock signal SCLK when the first digital code OUT_S is an n bit. That is, the time point at which the amplifier clock signal QAMP is inactivated may synchronize with the external clock signal ADC_CK, but the time point at which the amplifier clock signal QAMP is activated may not synchronize with the external clock signal ADC_CK. Based on the above-mentioned operation, the bandwidth specification of the amplification unit (200 in FIG. 1) may be lowered, thereby allowing of a reduction in the power consumption of the amplification unit (200 in FIG. 1).

The SAR circuit 160 may output a first digital code (OUT_S<n−1:0>) in response to a logic clock signal CLK and a comparative signal COT, COC. The SAR circuit 160 may only input any one of a first comparative signal COT and a second comparative signal COC. Specifically, the SAR circuit 160 may determine a value of each bit of the first digital code (OUT_S<n−1:0>), based on at least one or more of the first comparative signal COT and the second comparative signal COC, depending on the logic clock signal CLK (e.g., in response to the positive edge or the negative edge of the logic clock signal CLK). As described above, the logic clock signal CLK may include n numbers of pulses in one cycle of the external clock signal ADC_CK. The SAR circuit 160 may consecutively determine from the MSB (i.e., OUT_S<n−1>) to the LSB (i.e., OUT_S<0>) of the first digital code (OUT_S<n−1:0>) in each of the n numbers of pulses of the logic clock signal CLK. For example, the SAR circuit 160 may determine a corresponding bit of the first digital code (OUT_S<n−1:0>) as 1 when a value of the first comparative signal COT is logic high at the negative edge of the pulse of the logic clock signal CLK, and may determine a corresponding bit of the first digital code (OUT_S<n−1:0>) as 0 when a value of the first comparative signal COT is logic low at the negative edge of the pulse of the logic clock signal CLK.

Figure 3:
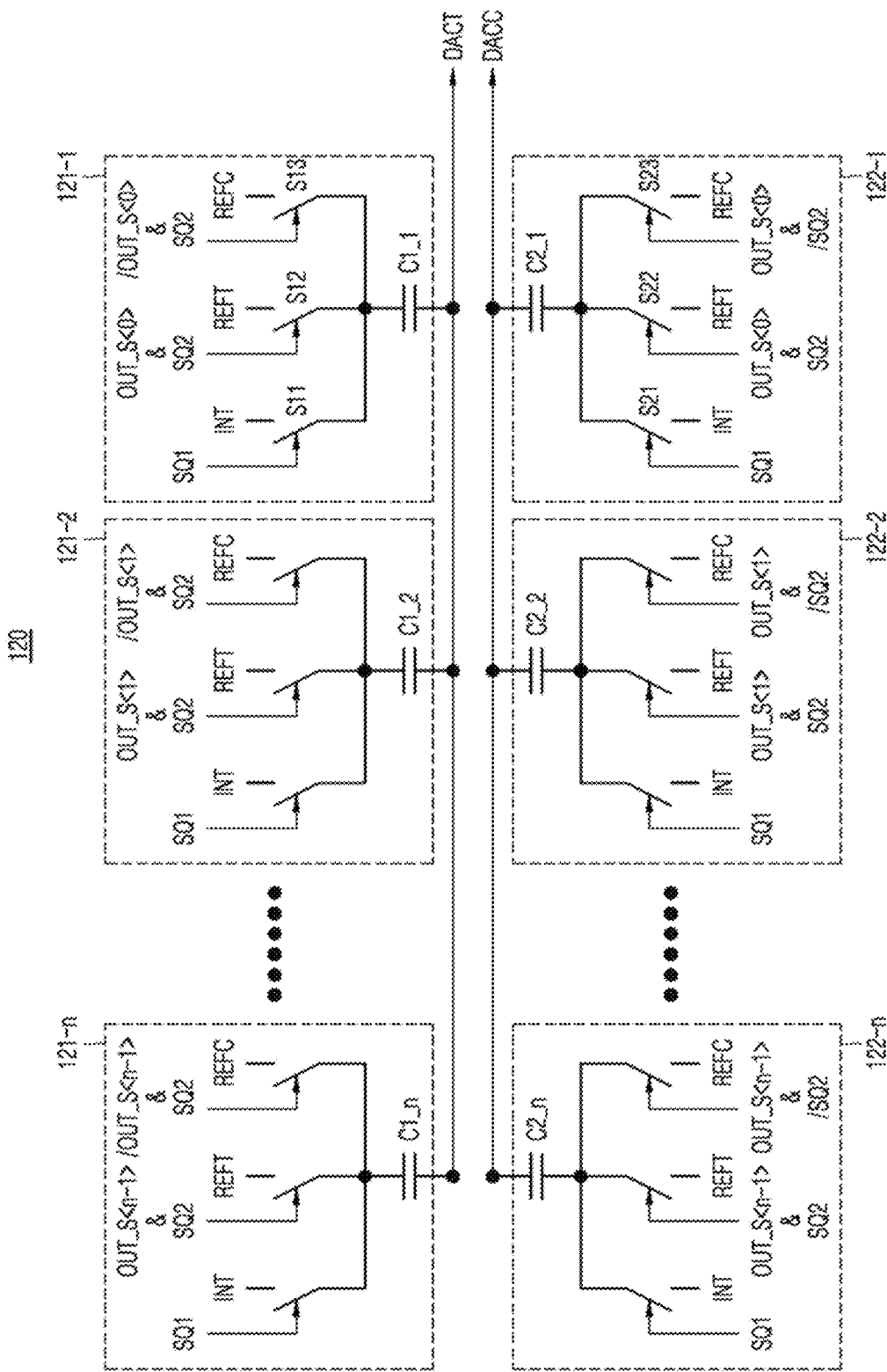
FIG. 3 is a view schematically showing the configuration of an example of an input unit of the SAR conversion unit of the analog-to-digital converter in FIG. 2.

FIG. 3 is a view schematically showing the configuration of an example of an input unit 120 of the SAR conversion unit 100 of the analog-to-digital converter in FIG. 2, and the input unit 120 may include a 1-1 input circuit 121-1 to a 1-n input circuit 121-n and a 2-1 input circuit 122-1 to a 2-n input circuit 122-n.

The 1-1 input circuit 121-1 may include a capacitor C1_1 having one end that connects to a terminal to which a first residual signal DACT is output, a switch S11 connecting between the other end of the capacitor C1_1 and a terminal to which a first input signal INT is input and being turned on and off in response to a first sampling clock signal SQ1, a switch S12 connecting between the other end of the capacitor C1_1 and a terminal to which a first reference signal REFT is supplied and being turned on and off in response to a signal where a second sampling clock signal SQ2 and the LSB (OUT_S<0>) of a first digital code are AND calculated, and a switch S13 connecting between the other end of the capacitor C1_1 and a terminal to which a second reference signal REFC is supplied and being turned on and off in response to a signal where the second sampling clock signal SQ2 and a signal (/OUT_S<0>), where the LSB of the first digital code is inverted, are AND calculated.

The 1-2 input circuit 121-2 to the 1-n input circuit 121-n may be respectively the same as the 1-1 input circuit 121-1 except that a bit of the first digital code (OUT_S<n−1:0>) and an inverted signal of the bit, respectively corresponding to the 1-2 input circuit 121-2 to the 1-n input circuit 121-n, are supplied instead of the LSB (OUT_S<0>) of the first digital code and the signal (/OUT_S<0>) where the LSB of the first digital code is inverted).

The 2-1 input circuit 122-1 may include a capacitor C2_1 having one end that connects to a terminal to which a second residual signal DACC is output, a switch S21 connecting between the other end of the capacitor C2_1 and a terminal to which a second input signal INC is input and being turned on and off in response to a first sampling clock signal SQ1, a switch S22 connecting between the other end of the capacitor C2_1 and a terminal to which a first reference signal REFT is supplied and being turned on and off in response to a signal where a second sampling clock signal SQ2 and the LSB (OUT_S<0>) of a first digital code are AND calculated, and a switch S23 connecting between the other end of the capacitor C2_1 and a terminal to which a second reference signal REFC is supplied and being turned on and off in response to a signal where a signal (/SQ2), where the second sampling clock signal SQ2 is inverted, and the LSB (OUT_S<0>) of the first digital code is inverted are AND calculated.

The 2-2 input circuit 122-2 to the 2-n input circuit 122-n may be respectively the same as the 2-1 input circuit 122-1 except that a bit of the first digital code (OUT_S<n−1:0>), respectively corresponding to the 2-2 input circuit 122-2 to the 2-n input circuit 122-n, is supplied instead of the LSB (OUT_S<0>) of the first digital code.

Figure 4:
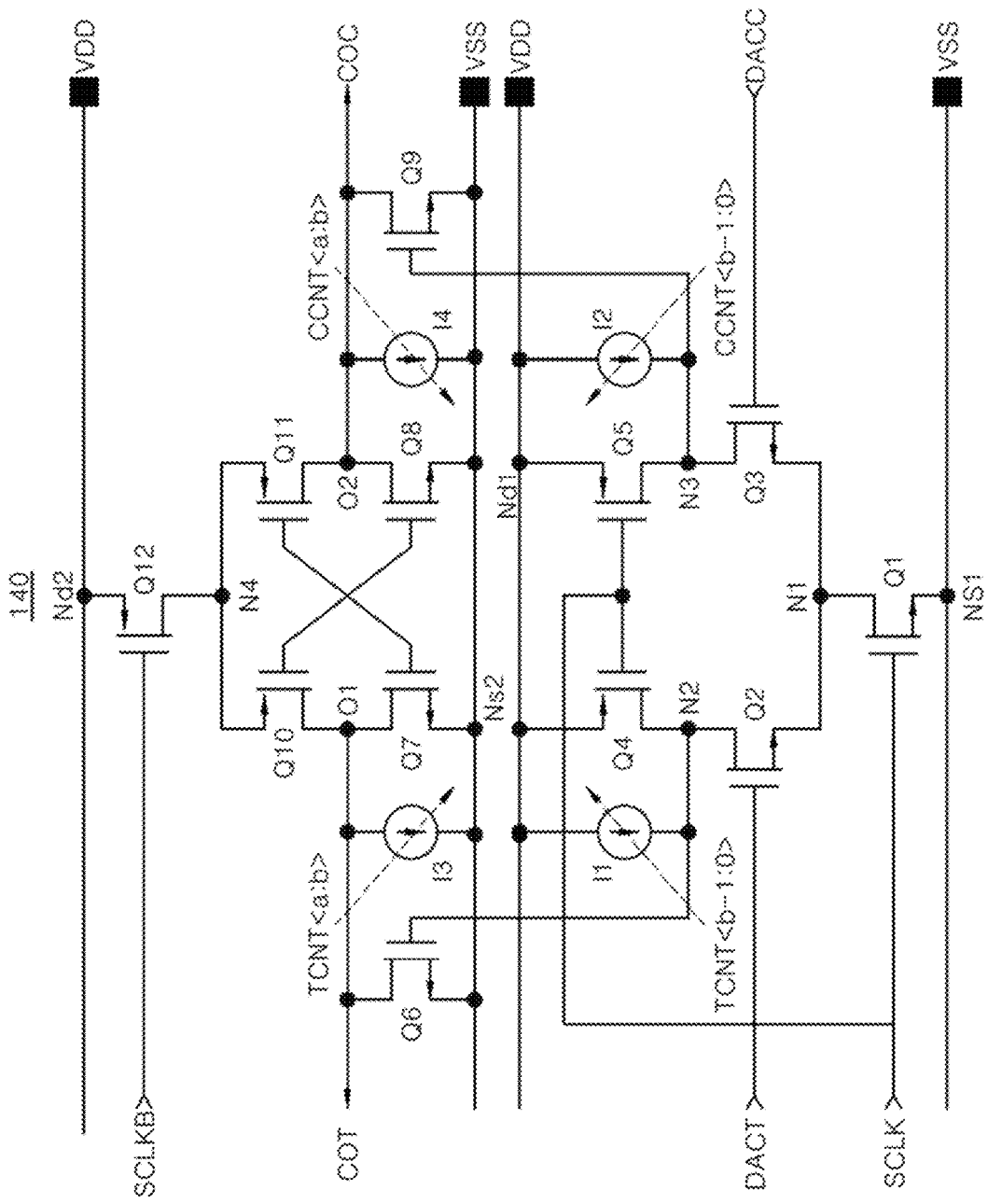
FIG. 4 is a view schematically showing the configuration of an example of a comparator of the SAR conversion unit of the analog-to-digital converter in FIG. 2.

FIG. 4 is a view schematically showing the configuration of an example of a comparator 140 of the SAR conversion unit 100 of the analog-to-digital converter in FIG. 2.

The comparator 140 may include a plurality of transistors Q1-Q12 and a plurality of current sources I1-I4.

The plurality of transistors Q1-Q12 may compare a first residual signal DACT and a second residual signal DACC in response to a first internal clock signal SCLK and a second internal clock signal SCLKB, and based on results of the comparison, output a first comparative signal COT and a second comparative signal COC.

The plurality of current sources I1-I4 may operate in response to a calibration signal (TCNT<a:0>, CCNT<a:0>), and compensate the offset of the comparator 140.

A transistor Q1 may connect between a terminal Ns1, to which reference voltage VSS is supplied, and a first node N1, and include a gate to which a first internal clock signal SCLK is supplied. The transistor Q1 may be an NMOS transistor.

The transistor Q2 may connect between the first node N1 and a second node N2, and include a gate to which a first residual signal DACT is supplied. The transistor Q2 may be an NMOS transistor.

A transistor Q3 may connect between the first node N1 and a third node N3, and include a gate to which a second residual signal DACC is supplied. The transistor Q3 may be an NMOS transistor.

A transistor Q4 may connect between the second node N2 and a terminal Nd1 to which driving voltage VDD is supplied, and include a gate to which a first internal clock signal SCLK is supplied. The transistor Q4 may be a PMOS transistor.

A transistor Q5 may connect between the third node N3 and the terminal Nd1 to which driving voltage VDD is supplied, and include a gate to which a first internal clock signal SCLK is supplied. The transistor Q5 may be a PMOS transistor.

A transistor Q6 may connect between a terminal Ns2 to which reference voltage VSS is supplied and a first output node O1 to which a first comparative signal COT is output, and include a gate to which a signal of the second node N2 is supplied. The transistor Q6 may be an NMOS transistor.

A transistor Q7 may connect between the terminal Ns2, to which reference voltage VSS is supplied, and the first output node O1. The transistor Q7 may be an NMOS transistor.

A transistor Q8 may connect between the terminal Ns2 to which reference voltage VSS is supplied and a second output node O2 to which a second comparative signal COC is output. The transistor Q8 may be an NMOS transistor.

A transistor Q9 may connect between the terminal Ns2, to which reference voltage VSS is supplied, and the second output node O2, and include a gate to which a signal of the third node N3 is supplied. The transistor Q8 may be an NMOS transistor.

A transistor Q10 may connect between the first output node O1 and a fourth node N4. The transistor Q10 may be a PMOS transistor. A gate of the transistor Q10 and the gate of the transistor Q8 may connect each other.

A transistor Q11 may connect between the second output node O2 and the fourth node N4. The transistor Q11 may be a PMOS transistor. A gate of the transistor Q11 and the gate of the transistor Q7 may connect to each other.

A transistor Q12 may connect between the fourth node N4 and a terminal Nd2 to which driving voltage VDD is supplied, and include a gate to which a second internal clock signal SCLKB is supplied. The transistor Q12 may be a PMOS transistor.

A current source I1 may connect between the terminal Nd1, to which driving voltage VDD is supplied, and the second node N2, and vary the magnitude of electric current flowing between the terminal Nd1 and the second node N2 in response to a partial code (TCNT<b−1:0>) of a first calibration code (TCNT<a:0>).

A current source I2 may connect between the terminal Nd1, to which driving voltage VDD is supplied, and the third node N3, and vary the magnitude of electric current flowing between the terminal Nd1 and the third node N3 in response to a partial code (CCNT<b−1:0>) of a second calibration code (CCNT<a:0>).

A current source I3 may connect between the first output node O1 and the terminal Ns2 to which reference voltage VSS is supplied, and the third node N3, and vary the magnitude of electric current flowing between the first output node O1 and the terminal Ns2 in response to the remaining code (TNCT<a:b>) of the first calibration code (TCNT<a:0>).

A current source I4 may connect between the second output node O2 and the terminal Ns2 to which reference voltage VSS is supplied, and the third node N3, and vary the magnitude of electric current flowing between the second output node O2 and the terminal Ns2 in response to the remaining code (CNCT<a:b>) of the second calibration code (CCNT<a:0>).

As described above, the SAR conversion unit (100 in FIGS. 1 and 2) may provide the comparative signal COT, COC to the calibration circuit (500 in FIG. 1) and receive the first calibration code (TCNT<a:0>) and the second calibration code (CCNT<a:0>) from the calibration circuit (500 in FIG. 1).

At a time of the calibration operation, a first input signal INT and a second input signal INC, being input to the SAR conversion unit (100 in FIGS. 1 and 2), may be the same signal. Then the calibration circuit (500 in FIG. 1) may adjust the first calibration code (TCNT<a:0>) and the second calibration code (CCNT<a:0>) until the comparative signals COT, COC have an unstable value, i.e., such that the comparative signals COT, COC incapable of determining the value of a data bit is output, and after the adjustment, may activate a calibration ending signal CAL_OFF.

Figure 5:
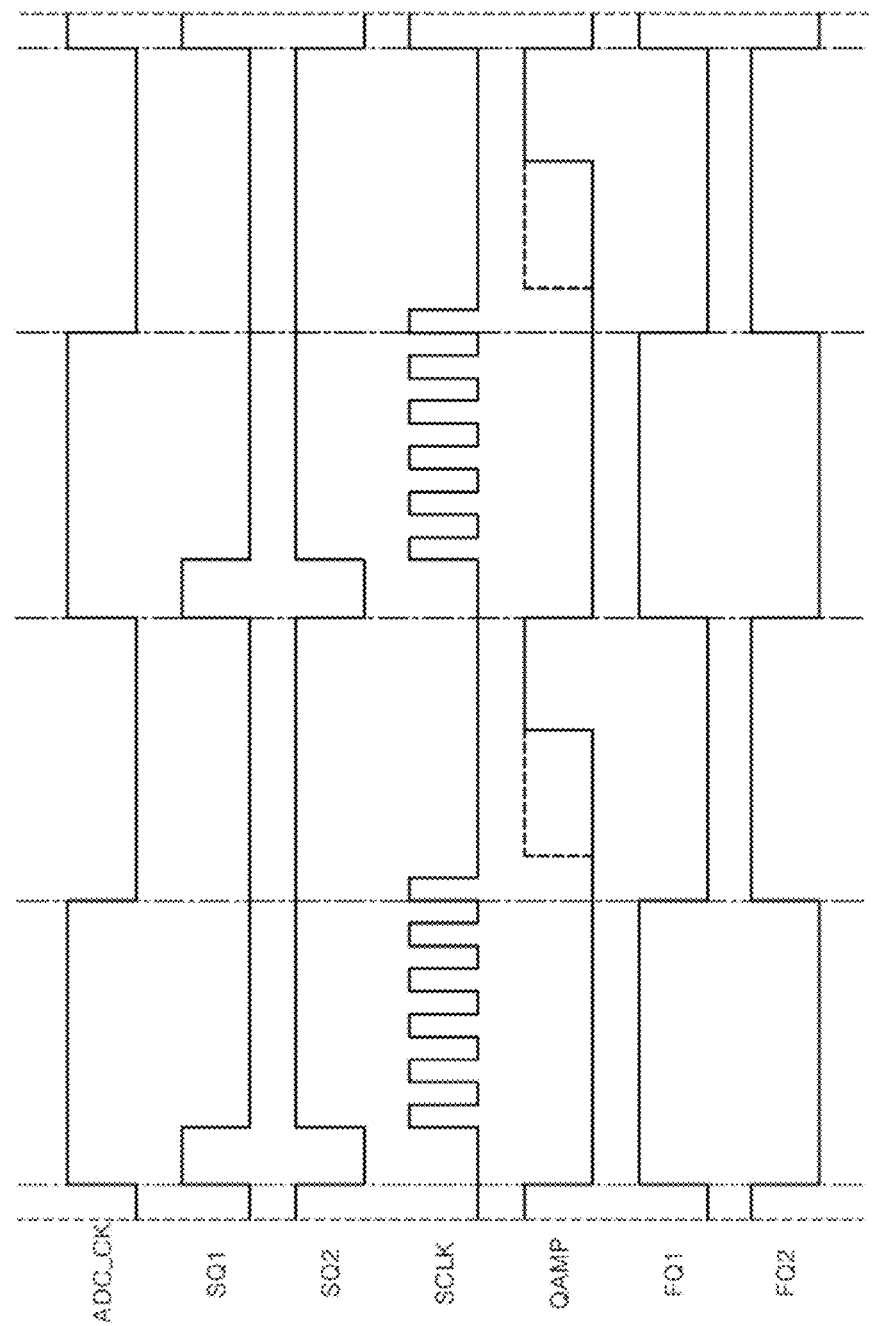
FIG. 5 is a signal timing diagram for describing the operation of the analog-to-digital converter of one embodiment.

FIG. 5 is a signal timing diagram for describing the operation of the analog-to-digital converter of one embodiment and shows a first digital code (OUT_S<n−1:0>) output from the SAR conversion unit (100 in FIGS. 1 and 2) is 6 bits.

The SAR conversion unit (100 in FIGS. 1 and 2) (specifically, the clock unit (110 in FIG. 2) of the SAR conversion unit (100 in FIGS. 1 and 2)) may generate a first sampling clock signal SQ1 and a second sampling clock signal SQ2 in response to an external clock signal ADC_CK.

When the first sampling clock signal SQ1 is at a high level, the SAR conversion unit (100 in FIGS. 1 and 2)

(specifically, the input unit (120 in FIGS. 2 and 3) of the SAR conversion unit (100 in FIGS. 1 and 2)) may sample the input signal INT, INC. The capacitor of the input unit (120 in FIGS. 2 and 3) may accumulate charges corresponding to the magnitude of the input signal INT, INC such that the input signal INT, INC is sampled.

As the input signal INT, INC is sampled, the SAR conversion unit (100 in FIGS. 1 and 2) (specifically, the controller (150 in FIG. 2) of the SAR conversion unit (100 in FIGS. 1 and 2)) may generate an internal clock signal SCLK in response to the second sampling clock signal SQ2. Though not illustrated, the SAR conversion unit (100 in FIGS. 1 and 2) (specifically, the controller (150 in FIG. 2) of the SAR conversion unit (100 in FIGS. 1 and 2)) may also generate a clock signal (SCLKB in FIGS. 2 to 4) where the internal clock signal SCLK in FIG. 5 is inverted. Additionally, the SAR conversion unit (100 in FIGS. 1 and 2) may convert the input signal INT, INC to a first digital code (OUT_S<n−1:0> in FIGS. 1 and 2) in response to the internal clock signal SCLK, based on the SAR method.

Specifically, the controller (150 in FIG. 2) may generate the positive edge of a first pulse of the internal clock signal SCLK in response to the positive edge of the second sampling clock signal SQ2. The comparator (140 in FIG. 2) may compare residual signals DCAT, DCAC, and based on results of the comparison, may output comparative signals COT, COC, in response to a high level of the internal clock signal SCLK. As the comparative signals COT, COC are output to the extent that the MSB (OUT_S<n−1>) of the first digital code (OUT_S<n−1:0> in FIGS. 1 and 2) can be determined, the controller (150 in FIG. 2) changes the level of the internal clock signal SCLK to a low level, and based on at least one of the comparative signals COT, COC, the SAR circuit (160 in FIG. 2) determines the MSB (OUT_S<n−1>) of the first digital code (OUT_S<n−1:0> in FIGS. 1 and 2). As predetermined time passes by after the level of the internal clock signal SCLK changes from a high level to a low level, the controller (150 in FIG. 2) changes the level of the internal clock signal SCLK to a high level, and then repeats the above-mentioned process until the controller determines from a following bit data (OUT_S<n−2>) of the first digital code (OUT_S<n−1:0> in FIGS. 1 and 2) to the LSB (OUT_S<0>) of the first digital code (OUT_S<n−1:0> in FIGS. 1 and 2). After the controller determines the LSB (OUT_S<0>) of the first digital code (OUT_S<n−1:0> in FIGS. 1 and 2), the SAR conversion unit (100 in FIGS. 1 and 2) (specifically, the input unit (120 in FIGS. 2 and 3) of the SAR conversion unit (100 in FIGS. 1 and 2)) may output residual signals DACT, DACC to the amplification unit (200 in FIG. 1).

As the number of the pulses of the internal clock signal SCLK becomes the number (6 in FIG. 5) of bits of the first digital code (OUT_S<n−1:0> in FIGS. 1 and 2), the controller (150 in FIG. 2) outputs an amplifier clock signal QAMP. As illustrated in FIG. 5, the time point at which the amplifier clock signal QAMP is inactivated may be fixed to the time point at which the level of the second sampling clock signal SQ2 changes from a high level to a low level. However, the time point at which the amplifier clock signal QAMP is activated may vary.

The amplification unit (200 in FIG. 1) amplifies the residual signals DACT, DACC in response to the activated amplifier clock signal QAMP, and output the amplified residual signals OUTT, OUTC to the flash conversion unit (300 in FIG. 1).

The flash conversion unit (300 in FIG. 1) may convert the amplified residual signal (OUTT, OUTC in FIG. 1) to a second digital code (OUT_F<m−1:0> in FIG. 1) in response to a first flash clock signal FQ1 and a second flash clock signal FQ2. Various types of well-known flash conversion units may be used as the flash conversion unit (300 in FIG. 1).

Figure 6:
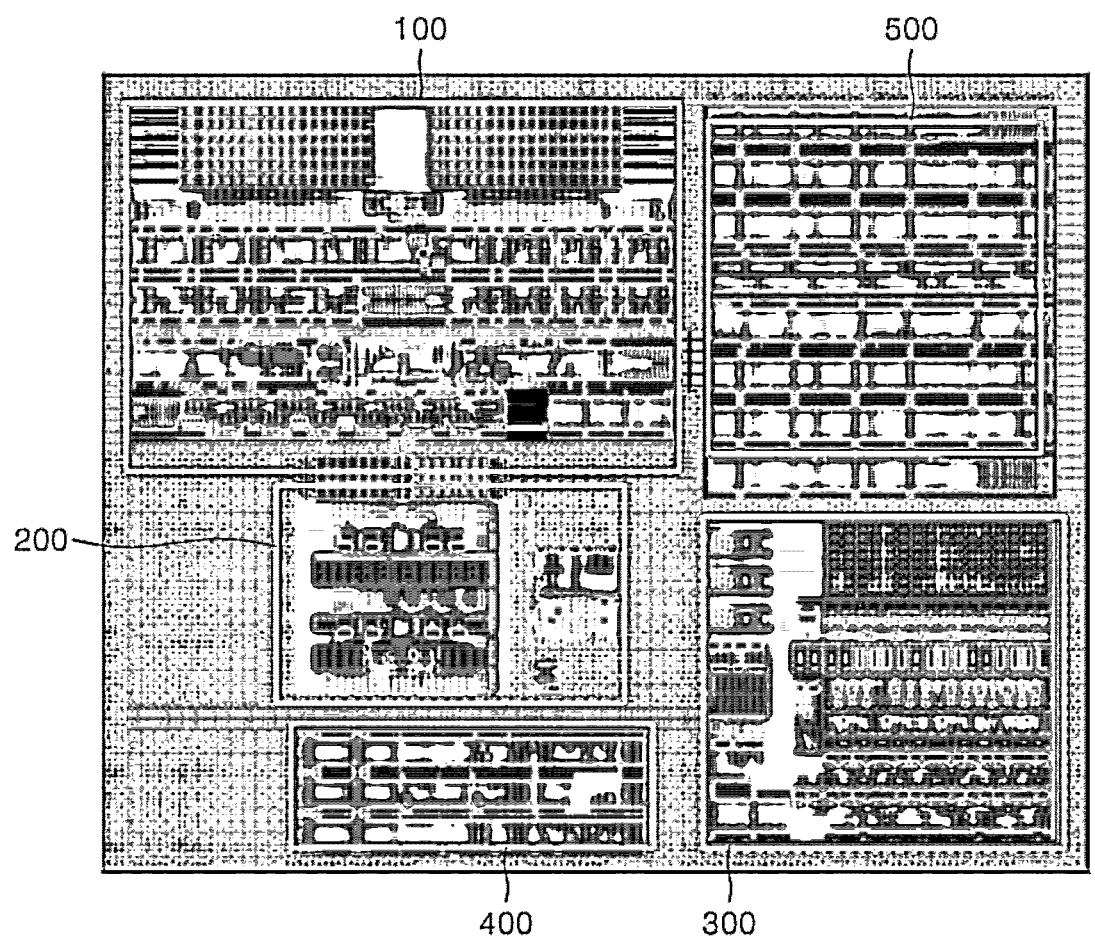
FIG. 6 is a view schematically showing a chip in which the analog-to-digital converter of one embodiment is formed.

FIG. 6 is a view schematically showing a chip in which the analog-to-digital converter of one embodiment is formed.

In one embodiment, the analog-to-digital converter may be integrated on a single chip.

As illustrated in FIG. 6, the SAR conversion unit 100 may be disposed in a first area of a chip. The amplification unit 200 may be disposed in a second area adjacent to the first area in a first direction. The output circuit 400 may be disposed in a third area adjacent to the second area in the first direction. The calibration circuit 500 may be disposed in a fourth area adjacent to the first area in a second direction across the first direction. The flash conversion unit 300 may be disposed in a fifth area adjacent to the fourth area in the first direction and adjacent to the second area and the third area in the second direction.

In the disposition of FIG. 6, the lengths of signal lines may be minimized.

The embodiments are described above with reference to a number of illustrative embodiments thereof. However, embodiments are not limited to the embodiments and drawings set forth herein, and numerous other modifications and embodiments can be drawn by one skilled in the art within the technical scope of the disclosure. Further, the effects and predictable effects based on the configurations in the disclosure are to be included within the range of the disclosure though not explicitly described in the description of the embodiments.

The invention claimed is:

1. An analog-to-digital converter, comprising:
a first conversion unit generating an internal clock signal, generating a first digital code and a residual signal by converting an input signal in a successive approximation register (SAR) method in response to the internal clock signal, and generating a flash clock signal in response to an external clock signal;
a second conversion unit generating a second digital code by converting the residual signal in a flash method in response to the flash clock signal; and
an output circuit generating an output digital signal in response to the first digital code and the second digital code,
wherein a state of the internal clock signal changes based on determination of bit data of the first digital code.

2. The analog-to-digital converter of claim 1, wherein the output circuit generates the output digital signal by combining the first digital code and the second digital code while correcting an error.

3. The analog-to-digital converter of claim 2, wherein the first digital code is n bits, and the second digital code is m bits, where n and m are integers equal to or greater than 2, and
the output circuit corrects an error by correcting a least significant bit (LSB) of the first digital code depending on a most significant bit (MSB) of the second digital code.

4. An analog-to-digital converter, comprising:
a first conversion unit generating an internal clock signal, generating a first digital code and a residual signal by converting an input signal in a successive approximation register (SAR) method in response to the internal clock signal, and generating a flash clock signal in response to an external clock signal;

a second conversion unit generating a second digital code by converting the residual signal in a flash method in response to the flash clock signal; and an output circuit generating an output digital signal in response to the first digital code and the second digital code, wherein the first conversion unit comprises:
- a clock unit outputting the flash clock signal and a sampling clock signal in response to the external clock signal;
- an input unit sampling the input signal in response to the sampling clock signal, and generating the residual signal, based on the sampled input signal and the first digital code;
- a comparator outputting a comparative signal depending on a value of the residual signal;
- a control unit generating the internal clock signal in response to the comparative signal and the sampling clock signal; and
- an SAR circuit generating the first digital code, based on the comparative signal.

5. The analog-to-digital converter of claim 4, wherein the input signal comprises a first input signal and a second input signal that are complementary, and the residual signal comprises a first residual signal and a second residual signal that are complementary, and the sampling clock signal comprises a first sampling clock signal that is activated during sampling from a time point when a first edge of the external clock signal is supplied, and a second sampling clock signal that is a signal where the first sampling clock signal is inverted, and wherein the input unit comprises:
- a plurality of first input circuits sampling the first input signal in response to the first sampling clock signal, and generating the first residual signal in response to the sampled first input signal and the second sampling clock signal; and
- a plurality of second input circuits sampling the second input signal in response to the first sampling clock signal, and generating the second residual signal in response to the sampled second input signal and the second sampling clock signal.

6. The analog-to-digital converter of claim 5, wherein each of the plurality of first input circuits comprises:
- a capacitor having one end that connects to a terminal to which the first residual signal is output;
- a first switch connecting between a terminal, to which the first input signal is supplied, and the other end of the capacitor, and being turned on and off in response to the first sampling clock signal;
- a second switch connecting between a terminal, to which a first reference signal is supplied, and the other end of the capacitor, and being turned on and off in response to a signal where a signal of corresponding bit data of the first digital code and the second sampling clock signal are AND calculated; and
- a third switch connecting between a terminal, to which a second reference signal is supplied, and the other end of the capacitor, and being turned on and off in response to a signal where an inverted signal of corresponding bit data of the first digital code and the second sampling clock signal are AND calculated.

7. The analog-to-digital converter of claim 5, wherein each of the plurality of second input circuits, comprises:
- a capacitor having one end that connects a terminal to which the second residual signal is output;
- a first switch connecting between a terminal, to which the second input signal is supplied, and the other end of the capacitor, and being turned on and off in response to the first sampling clock signal;
- a second switch connecting between a terminal, to which a first reference signal is supplied, and the other end of the capacitor, and being turned and off in response to a signal where a signal of corresponding bit data of the first digital code and the second sampling clock signal are AND calculated; and
- a third switch connecting between a terminal, to which a second reference signal is supplied, and the other end of the capacitor, and being turned on and off in response to a signal where a signal of corresponding bit data of the first digital code and an inverted signal of the second sampling clock signal are AND calculated.

8. The analog-to-digital converter of claim 5, wherein the comparative signal comprises a first comparative signal and a second comparative signal that are complementary, and the comparator compares the first residual signal and the second residual signal and outputs the first comparative signal and the second comparative signal.

9. The analog-to-digital converter of claim 8, wherein the analog-to-digital converter further comprises a calibration circuit that outputs a calibration signal in response to the first comparative signal and the second comparative signal, and the calibration signal corrects an offset of the comparator.

10. The analog-to-digital converter of claim 9, wherein the internal clock signal comprises a first internal clock signal and a second internal clock signal that are complementary, and the calibration signal comprises a first calibration signal, a second calibration signal, a third calibration signal and a fourth calibration signal, and wherein the comparator comprises:
- a first transistor connecting between a terminal, to which reference voltage is supplied, and a first node, and comprising a gate to which the first internal clock signal is supplied;
- a second transistor connecting between the first node and a second node, and comprising a gate to which the first residual signal is supplied;
- a third transistor connecting between the first node and a third node, and comprising a gate to which the second residual signal is supplied;
- a fourth transistor connecting between the second node and a terminal to which driving voltage is supplied, and comprising a gate to which the internal clock signal is supplied;
- a fifth transistor connecting between the third node and the terminal to which driving voltage is supplied, and comprising a gate to which the internal clock signal is supplied;
- a sixth transistor connecting between the terminal to which reference voltage is supplied and a first output node to which the first comparative signal is output, and comprising a gate to which a signal of the second node is supplied;
- a seventh transistor connecting between the terminal to which reference voltage is supplied and the first output node;
- an eighth transistor connecting between the terminal to which reference voltage is supplied and a second output node to which the second residual signal is output;

a ninth transistor connecting between the terminal to which reference voltage is supplied and the second output node, and comprising a gate to which a signal of the third node is supplied;

a tenth transistor connecting between the first output node and the fourth node, and comprising a gate that electrically connects to a gate of the eighth transistor;

an eleventh transistor connecting between the second output node and the fourth node, and comprising a gate that electrically connects to a gate of the seventh transistor;

a twelfth transistor connecting between the fourth node and the terminal to which driving voltage is supplied, and comprising a gate to which the second internal clock signal is supplied;

a first current source connecting between the terminal to which driving voltage is supplied and the second node, and adjusting magnitude of electric current that flows between the terminal, to which driving voltage is supplied, and the second node in response to the first calibration signal;

a second current source connecting between the terminal to which driving voltage is supplied and the third node, and adjusting magnitude of electric current that flows between the terminal, to which driving voltage is supplied, and the third node in response to the third calibration signal;

a third current source connecting between the first output node and the terminal to which reference voltage is supplied, and adjusting magnitude of electric current that flows between the first output node and the terminal, to which reference voltage is supplied, in response to the third calibration signal; and a fourth current source connecting between the second output node and the terminal to which reference voltage is supplied, and adjusting magnitude of electric current that flows between the second output node and the terminal, to which reference voltage is supplied, in response to the fourth calibration signal.

11. An analog-to-digital converter, comprising:

a first conversion unit generating an internal clock signal, generating a first digital code and a residual signal by converting an input signal in a successive approximation register (SAR) method in response to the internal clock signal, and generating a flash clock signal in response to an external clock signal;

a second conversion unit generating a second digital code by converting the residual signal in a flash method in response to the flash clock signal; and an output circuit generating an output digital signal in response to the first digital code and the second digital code, wherein the first conversion unit generates a comparative signal that is determined depending on magnitude of the residual signal, and based on the comparative signal, determines bit data of the first digital code.

12. The analog-to-digital converter of claim 11, wherein the analog-to-digital converter further comprises a calibration circuit that outputs a calibration signal for correcting an offset of the first conversion unit, based on the comparative signal, and the first conversion unit comprises at least one or more of current sources that operate in response to the calibration signal.

13. The analog-to-digital converter of claim 12, wherein the first conversion unit, the second conversion unit, the output circuit, and the calibration circuit are integrated on a signal chip.

14. The analog-to-digital converter of claim 12, wherein the second conversion unit comprises:

an amplification unit outputting an amplified residual signal by amplifying the residual signal; and a flash conversion unit converting the amplified residual signal to the second digital code in response to the flash clock signal.

15. The analog-to-digital converter of claim 14, wherein the first conversion unit is disposed in a first area of a chip, the amplification unit is disposed in a second area adjacent to the first area of the chip in a first direction, the output circuit is disposed in a third area adjacent to the second area of the chip in the first direction, the calibration circuit is disposed in a fourth area adjacent to the first area of the chip in a second direction across the first direction, and the flash conversion unit is disposed in a fifth area adjacent to the fourth area of the chip in the first direction and adjacent to the second area and the third area of the chip in the second direction.

* * * * *